United States Patent [19]

Ijichi et al.

[11] 4,147,991
[45] Apr. 3, 1979

[54] AUTOMATIC GAIN CONTROL APPARATUS

[75] Inventors: Sadayoshi Ijichi; Yasutaka Shimada, both of Soma, Japan

[73] Assignee: Alps Electric Co., Ltd., Japan

[21] Appl. No.: 836,361

[22] Filed: Sep. 26, 1977

[30] Foreign Application Priority Data

Sep. 27, 1976 [JP] Japan .................. 51-115618

[51] Int. Cl.² .............................................. H03G 3/10
[52] U.S. Cl. .................................. 330/284; 330/141;
330/279; 325/405
[58] Field of Search .................... 325/405, 414, 415;
330/145, 282, 284, 279, 141

[56] References Cited

U.S. PATENT DOCUMENTS

| | | | |
|---|---|---|---|
| 2,488,606 | 11/1949 | Sands | 325/405 X |
| 3,408,588 | 10/1968 | Rugo | 330/284 X |
| 3,518,585 | 6/1970 | Wilcox | 325/414 X |
| 4,030,035 | 6/1977 | Ienaka et al. | 325/405 X |

Primary Examiner—Lawrence J. Dahl
Attorney, Agent, or Firm—Guy W. Shoup; Gerard F. Dunne

[57] ABSTRACT

An apparatus for effecting automatic gain control comprises an attenuator employing pin junction diodes, a high-frequency amplifier employing a bipolar type automatic gain controlling transistor or a MOS-FET which is always supplied with automatic gain control signals, and switching means for selectively applying automatic gain control signals to the attenuator, thereby permitting increase of the gain control variable without deteriorating the noise factor and the cross modulation characteristic of the signal.

6 Claims, 5 Drawing Figures

AUTOMATIC GAIN CONTROL APPARATUS

BACKGROUND OF THE INVENTION

Field of the Invention

The invention relates to an automatic gain control circuit and, more particularly, to such a circuit which is adapted for use in high frequency amplifier circuits such as those used in tuners or the like.

Description of the Prior Art

Radio-frequency amplifier circuits such as those used in tuners have used bipolar type automatic gain controlling transistors (hereinafter referred to merely as AGC transistors) or metal-oxide-semiconductor type field-effect transistors (MOS-FET) which exhibit a relatively superior cross modulation characteristic. However, such transistor elements have been insufficient and have had numerous disadvantages such as described below with reference to FIG. 1, which figure shows the change in interference level causing 1% cross modulation as a function of the gain controlled variable. An AGC transistor used in common emitter fashion exhibits an inferior cross modulation characteristic at zero gain control variable as shown by the curve 1 and an AGC transistor used in common base fashion exhibits a cross modulation characteristic not improved at an increased gain controlled variable as shown by the curve 2. Also, a MOS-FET exhibits a cross modulation characteristic not improved much at an increased gain controlled variable as shown by the curve 3. The insufficient cross modulation characteristic causes cross modulation and a manual switched attenuator typically is provided in such a device as a television set so as to attenuate the input signals.

With the increase in technical level, inexpensive pin junction diodes having a sufficiently superior high-frequency characteristic have become available and a combination of an attenuator employing such pin junction diodes and a high frequency amplifier employing a MOS-FET permits the improvement of the cross modulation characteristic as shown by the curve 4.

On the other hand, such pin junction diodes have another disadvantage such as described below with reference to FIG. 2, which figure shows the change in noise factor (NF) as a function of gain controlled variable. The use of such pin junction diodes results in noise factor deterioration in proportion to the increase in gain controlled variable as shown by the curve 5, causing snow noises to appear in the picture of a television set in an area of a low radio-field intensity although such noise factor deterioration does not create any trouble in an area of high or intermediate radio-field intensity because of the high input signal level.

With the use of the AGC transistor or MOS-FET, a low noise factor of 2 to 5 dB in the range 5 to 10 dB of gain controlled variable appears as shown by the curve 6 of FIG. 2 and the noise factor deterioration causing snow noises found in the attenuator employing the pin junction diodes is not experienced.

SUMMARY OF THE INVENTION

It is, therefore, an object of the present invention to provide an automatic gain control apparatus which will be free from the above-mentioned and other disadvantages of the conventional apparatus.

Another object of the present invention is to permit increasing of the gain control variable without deterioration of the noise factor and cross modulation characteristic attendant upon conventional automatic gain control apparatus.

Still another object of the present invention is to permit stable automatic gain control operation in a wide range of radio-field intensity.

In accordance with the present invention, there is provided an improved automatic gain control apparatus which comprises an attenuator for attenuating signals fed thereto from an antenna, a high frequency amplifier for amplifying the signals, and a circuit for applying automatic gain control signals to the high-frequency amplifier and to means adapted to apply the automatic gain control signal to the attenuator when the level of the input signal exceeds a predetermined value so as to start the operation of the attenuator. The means may be a switch circuit including a transistor having its base electrode biased at a predetermined potential and its emitter electrode coupled with the gain control signal so that the transistor conducts when the gain control signal exceeds a predetermined level so as to apply the gain control signal to the attenuator. In addition, a variable resistor may be provided to freely select the potential biased to the base electrode of the transistor.

BRIEF DESCRIPTION OF THE DRAWINGS

Other objects and advantages of the present invention will become apparent upon reading the following detailed description and upon reference to the drawings in which.

While the present invention will be described in connection with preferred embodiments, it will be understood that the invention is not intended to be limited to those embodiments. On the contrary, the invention is intended to cover all alternatives, modifications and equivalents as may be included within the spirit and scope of the appended claims.

DETAILED DESCRIPTION OF THE INVENTION

Figure 3:
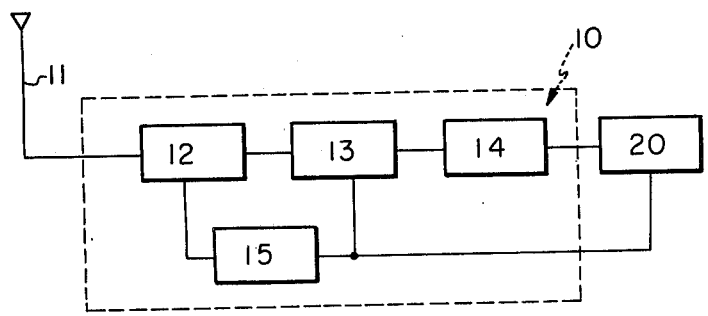
FIG. 3 is a block diagram showing an automatic gain control apparatus in accordance with one embodiment of the present invention.

Referring now to FIG. 3, there is illustrated in block diagram an automatic gain control apparatus in accordance with an embodiment of the present invention which comprises a tuner 10 and an automatic gain control signal generator circuit 20. The tuner 10 comprises an attenuator 12 employing pin junction diodes for attenuating signals applied thereto from an antenna 11, a high-frequency amplifier 13 for amplifying the signals fed from the attenuator 12, a frequency converter circuit 14 for converting the signals fed from the amplifier 13 into intermediate-frequency signals and applying them to the circuit 20, and a switch circuit 15.

When a signal is fed from the antenna 11, which has a low radio-field intensity, no AGC signal appears at the output terminal of the circuit 20 so that the gain control variable in both the attenuator 12 and the high-frequency amplifier 13 is zero. When a signal is fed from the antenna 11, having a high or intermediate radio-field intensity, an AGC signal is produced from the circuit 20 and is applied to the high-frequency amplifier 13 wherein automatic gain control is effected, while at the same time the AGC signal is applied to the switch circuit 15. The switch circuit 15 serves not to apply the AGC signal to the attenuator 12 when the AGC signal voltage is lower than a predetermined voltage. At this time, thus, gain control is effected only in the high-frequency amplifier 13 and is not effected in the attenuator 12, whereby the occurrence of snow noises resulting from noise factor deterioration can be prevented.

When a signal having a high or super-high radio-field intensity is fed from the antenna 11, the AGC signal from the circuit 20 further increases so as to increase the gain controlled variable in the high-frequency amplifier 13, and when the AGC signal increases such that its voltage exceeds the voltage predetermined in the switch circuit 15, the AGC signal is applied to the attenuator 12, where automatic gain control is then also effected. This remarkably improves the cross modulation characteristic and eliminates the need for a conventional manually switched attenuator. In addition, more than 100 dB of gain controlled variable can be obtained in both the attenuator 12 and the high-frequency amplifier 13, and automatic gain control can be effected for signals having any radio-field intensity in accordance with the present invention, although the gain controlled variable obtained in either of the attenuator 12 and the high-frequency amplifier 13 is about 50 dB at the utmost.

Figure 4:
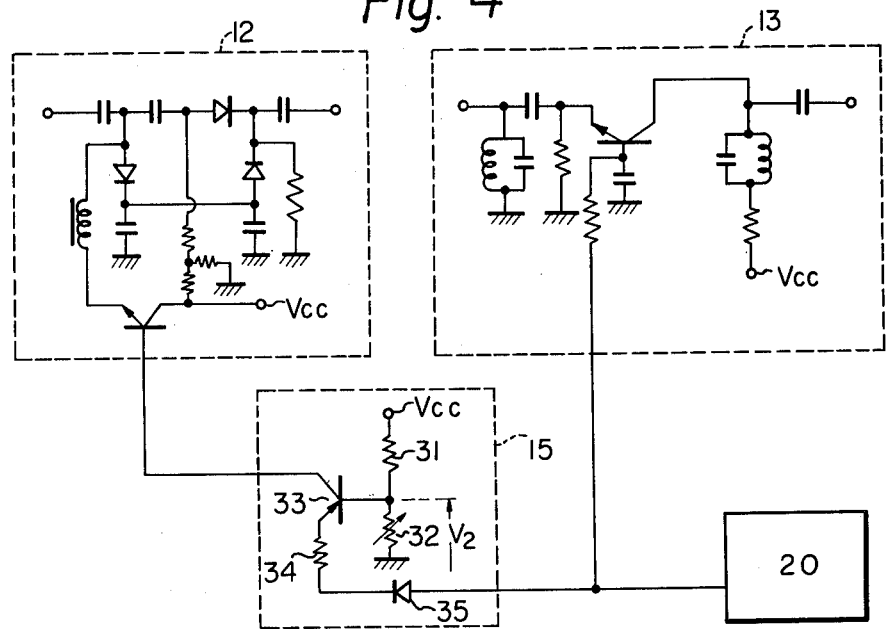
FIGS. 4 and 5 are circuit diagrams showing the detailed arrangements in accordance with different embodiments of the present invention.

FIG. 4 is a circuit diagram showing a detailed circuit of the automatic gain control apparatus in accordance with one embodiment of the present invention. In FIG. 4, the apparatus comprises an attenuator 12 employing pin junction diodes, a high-frequency amplifier 13 employing an AGC NPN transistor, and a switch circuit 15 employing a switching transistor 33 to which AGC signals are supplied from the circuit 20. When the voltage V1 of the AGC signal at zero gain controlled variable is lower than the voltage V2 obtained by dividing Vcc by the resistor 31 and the variable resistor 32 of the switch circuit 15, and applied to the base of a transistor 33, the transistor 33 is rendered non-conductive and the gain controlled variable applied to the attenuator 12 is zero. With increasing AGC signal from the circuit 20, the current through the collector of the NPN transistor of the high-frequent amplifier 13 increases so that the high-frequency amplifier 13 operates under the automatic gain control. At this time, however, the transistor 33 is held non-conductive and the attenuator 12 remains non-operative. When the AGC signal further increases and has its voltage exceeding the sum of the base voltage, the base-emitter voltage of the transistor 33, and the threshold voltage of the diode 35, the attenuator 12 starts operating.

As described above, both the attenuator 12 and the high-frequency amplifier 13 operate under automatic gain control with input signals of a high or super-high radio-field intensity so that more than 100 dB of gain control can be effected while having an extremely superior cross modulation characteristic, whereas only the high-frequency amplifier 13 operates under automatic gain control when the input signals are of a lower radio-field intensity so that noise factor deterioration can be prevented.

The variable resistor 32 permits a proper selection of the voltage V2 in accordance with radio-field conditions.

Figure 1:
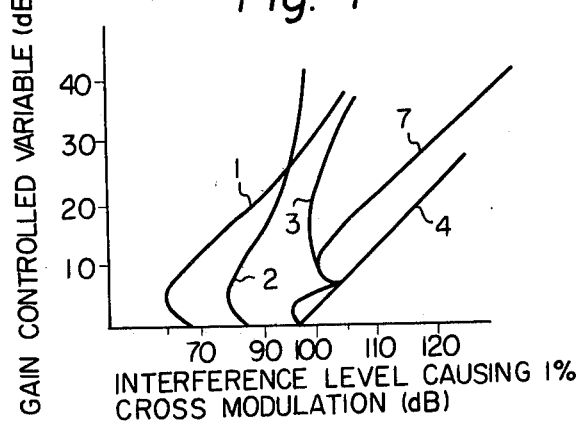
FIG. 1 illustrates curves of gain controlled variable versus interference level causing 1% cross modulation.
Figure 2:
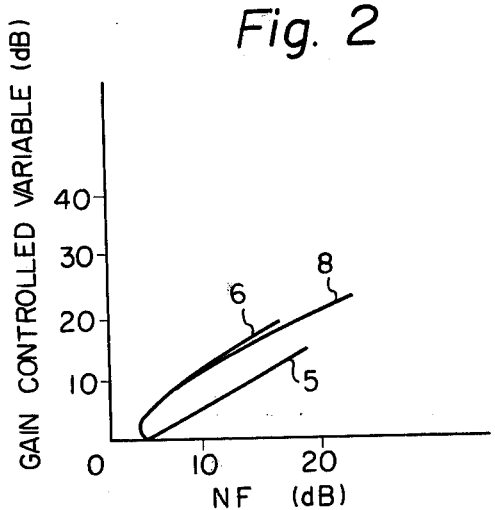
FIG. 2 illustrates curves of gain controlled variable versus noise factor.
Figure 5:
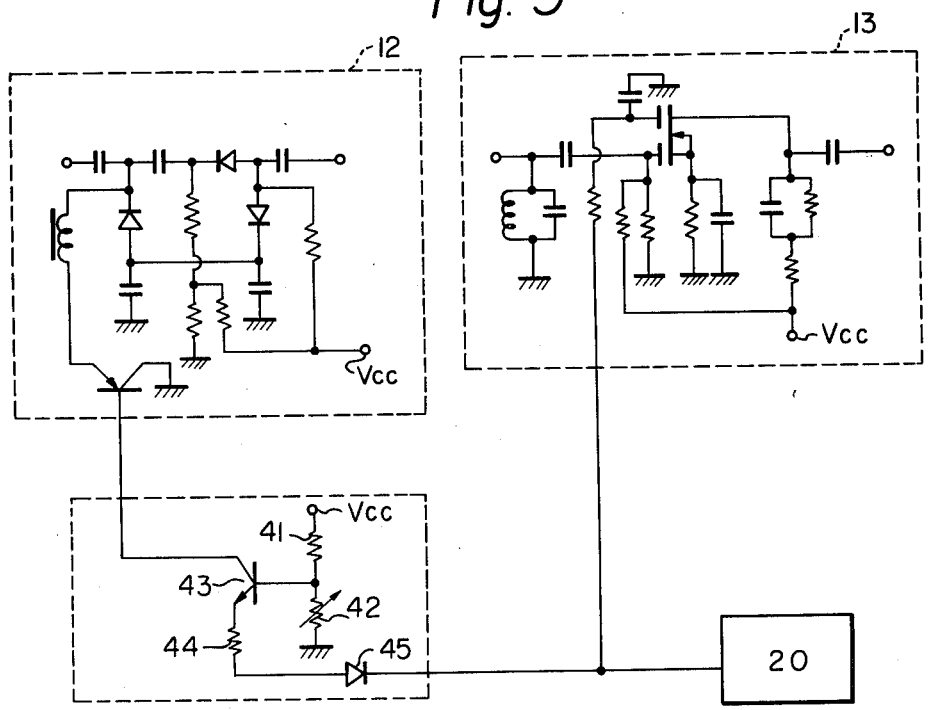

FIG. 5 is a circuit diagram showing an alternative embodiment of the present invention in which the high-frequency amplifier 13 includes a MOS-FET. The circuit shown in FIG. 5 is generally the same as shown in FIG. 4 except that the polarities of the transistor, diodes, and supply voltages are reversed because of its reverse type AGC arrangement. The cross modulation characteristic and the noise factor characteristic of the embodiment shown in FIG. 5 are respectively illustrated by the curve 7 in FIG. 1 and the curve 8 in FIG. 2.

The automatic gain control apparatus in accordance with the present invention wherein only the high-frequency amplifier operates under automatic gain control with input signals of a low radio-field intensity whereas both the attenuator the high-frequency amplifier operate under automatic gain control with input signals having a higher radio-field intensity permits reception with a superior cross modulation characteristic and a superior noise factor characteristic, and permits stable automatic gain control operation in a wide radio-field intensity range so as to permit remarkable increases in the gain controlled variable. In addition, the variable resistor provided for determining the potential at the base of the transistor in the switch circuit permits a free selction of a potential at which the attenuator starts operating under automatic gain control in accordance with reception areas.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An automatic gain control apparatus comprising
   an attenuator for attenuating input signals fed thereto from an antenna,
   a high frequency amplifier receiving the output from said attenuator for amplifying said input signals,
   AGC means for producing an automatic gain control signal,
   means for supplying said automatic gain control signal to said high-frequency amplifier and said attenuator, and
   switch means connected between said AGC means and said attenuator for selectively passing said automatic gain control signal to said attenuator, said switch means being adapted to supply said automatic gain control signal to said attenuator when the level of said input signal exceeds a predetermined value so as to start the operation of said attenuator.

2. An automatic gain control apparatus as set forth in claim 1, wherein said switch means including a transistor having its base biased at a predetermined potential and its emitter coupled with the gain control signal so that said transistor conducts when the gain control signal sufficiently exceeds the predetermined level so as to apply said gain control signal to said attenuator.

3. An automatic gain control apparatus as set forth in claim 2, wherein a variable resistor is provided to select the potential biased to the base electrode of said transistor.

4. An automatic gain control apparatus as set forth in claim 1, wherein said attenuator includes pin junction diodes and said high-frequency amplifier includes an automatic gain control transistor.

5. An automatic gain control apparatus as set forth in claim 1, wherein said attenuator includes pin junction diodes and said high-frequency amplifier includes a metal-oxide-semi-conductor type field-effect transistor.

6. An automatic gain control apparatus as set forth in claim 1, said AGC means produces an automatic gain control signal proportional to the radio-field intensely of said input signal.

* * * * *